United States Patent
Tantos

(10) Patent No.: US 9,455,745 B2
(45) Date of Patent: Sep. 27, 2016

(54) ENCODING WITH INTEGRATED ERROR-DETECTION

(71) Applicant: MICROSOFT TECHNOLOGY LICENSING, LLC, Redmond, WA (US)

(72) Inventor: Andras Tantos, Bellevue, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 327 days.

(21) Appl. No.: 13/773,329

(22) Filed: Feb. 21, 2013

(65) Prior Publication Data

US 2014/0237316 A1 Aug. 21, 2014

(51) Int. Cl.
- *H03M 13/00* (2006.01)
- *H03M 13/05* (2006.01)
- *H03M 5/14* (2006.01)
- *H03M 13/31* (2006.01)

(52) U.S. Cl.
CPC ............. *H03M 13/05* (2013.01); *H03M 5/145* (2013.01); *H03M 13/31* (2013.01)

(58) Field of Classification Search
CPC ..... H03M 13/05; H03M 13/31; H03M 5/145
See application file for complete search history.

(56) References Cited

U.S. PATENT DOCUMENTS

| | | | | |
|---|---|---|---|---|
| 6,425,107 B1 * | 7/2002 | Caldara | ................ | G06T 9/005 341/100 |
| 2003/0237038 A1 | 12/2003 | Cole et al. | | |
| 2004/0088633 A1 | 5/2004 | Lida et al. | | |
| 2005/0237981 A1 * | 10/2005 | Aiello | ................ | H04W 56/0015 370/337 |
| 2007/0260965 A1 * | 11/2007 | Schmidt | ................ | H04L 1/0045 714/799 |
| 2010/0153805 A1 | 6/2010 | Schmidt et al. | | |
| 2010/0205506 A1 * | 8/2010 | Hara | .................... | H03M 5/145 714/755 |
| 2012/0060070 A1 * | 3/2012 | Stark | .................... | H03M 5/145 714/752 |

OTHER PUBLICATIONS

European Patent Office, Second Written Opinion Received for PCT Patent Application No. PCT/US2014/016655, Germany, Nov. 4, 2014, 8 Pages.
European Patent Office, International Search Report & Written Opinion of PCT/US2014/016655, May 15, 2014, 11 Pages.
Martin, GN: "A Rate 8/10 DC Balanced Code With Local Parity", A IBM Technical Disclosure, Feb. 18, 2005, 4 Pages.

(Continued)

*Primary Examiner* — Bryce Bonzo
*Assistant Examiner* — Thien D Nguyen
(74) *Attorney, Agent, or Firm* — Micah Goldsmith; Judy Yee; Micky Minhas

(57) ABSTRACT

A method of encoding a data set including one or more n-bit pre-coded symbols in an encoder of a computing system includes determining a plurality of n+2-bit code words, each of the plurality of n+2-bit code words having two or greater Hamming distance from one another. The method further includes mapping each of the plurality of n+2-bit code words to a corresponding source symbol, receiving the one or more n-bit pre-coded symbols at the encoder, matching each n-bit pre-coded symbol to a corresponding n+2-bit code word based on the mapping to produce encoded data, and outputting the encoded data.

20 Claims, 7 Drawing Sheets

(56) References Cited

OTHER PUBLICATIONS

Liang, Chien-Chan, "Improvement of Performance in Digital Recording with Distanced Modulation Code", In Proceedings of the International Conference on Consumer Electronics, Jun. 8, 1993, pp. 120-121.

Stallings, William, "Gigabit Ethernet", Retrieved at <<http://www.cisco.com/web/about/ac123/ac147/ac174/ac199/about_cisco_ipj_archive_article09186a00800c85a6.html>>, The Internet Protocol Journal—vol. 2, No. 3, Retrieved Date: Nov. 21, 2012, pp. 4.

"PX1011B—PCI Express stand-alone X1 PHY", Retrieved at <<http://www.nxp.com/documents/data_sheet/PX1011B.pdf>>, Product data sheet—Rev. 6, Oct. 30, 2010, pp. 32.

Chi, et al., "Transmission and Optical Label Swapping for 4 40 Gb/s WDM Signals Deploying Orthogonal ASK/DPSK Labeling", Retrieved at <<http://ieeexplore.ieee.org/stamp/stamp.jsp?tp=&arnumber=1432817>>, IEEE Photonics Technology Letters, vol. 17, No. 6, May 2005, pp. 3.

Mischeletti, et al., "Going Native with SuperSpeed", Retrieved at <<http://www.embeddedintel.com/special_features.php?article=2585>>, Retrieved Date: Nov. 21, 2012, pp. 3.

IPEA European Patent Office, International Preliminary Report on Patentability Issued in PCT Patent Application PCT/US2014/016655, Feb. 4, 2015, 10 Pages.

* cited by examiner

SOURCE CODE (HEX) : CODE WORD (BIN)
---------------------------------------------
0x000: 0001010111
0x001: 0001011011
0x002: 0001011101
0x003: 0001011110  (COM symbol)
0x004: 0001100111
0x005: 0001101011
0x006: 0001101101
0x007: 0001101110
0x008: 0001110011
0x009: 0001110101
0x00a: 0001110110
0x00b: 0001111001
0x00c: 0001111100
0x00d: 0010010111
0x00e: 0010011011
0x00f: 0010011101
0x010: 0010011110
0x011: 0010100111
0x012: 0010101011
0x013: 0010101101
0x014: 0010101110
0x015: 0010110011
0x016: 0010110101
0x017: 0010110110
0x018: 0010111001
0x019: 0011000111
0x01a: 0011001011
0x01b: 0011001101
0x01c: 0011001110
0x01d: 0011010011
0x01e: 0011010101
0x01f: 0011010110
0x020: 0011011001
0x021: 0011011010
0x022: 0011011100
0x023: 0011100011
0x024: 0011100101
0x025: 0011100110
0x026: 0011101001
0x027: 0011101010
0x028: 0011101100
0x029: 0011110001
0x02a: 0011110010
0x02b: 0011110111-1100001000
0x02c: 0011111000

SOURCE CODE (HEX) : CODE WORD (BIN)
---------------------------------------------
0x02d: 0011111011-1100000100
0x02e: 0011111101-1100000010
0x02f: 0100011011
0x030: 0100011101
0x031: 0100011110
0x032: 0100100111
0x033: 0100101011
0x034: 0100101101
0x035: 0100101110
0x036: 0100110011
0x037: 0100110101
0x038: 0100110110
0x039: 0100111001
0x03a: 0100111100
0x03b: 0101000111
0x03c: 0101001011
0x03d: 0101001101
0x03e: 0101001110
0x03f: 0101010011
0x040: 0101010101
0x041: 0101010110
0x042: 0101011001
0x043: 0101011010
0x044: 0101011100
0x045: 0101100011
0x046: 0101100101
0x047: 0101100110
0x048: 0101101001
0x049: 0101101010
0x04a: 0101101100
0x04b: 0101110001
0x04c: 0101110010
0x04d: 0101110111-1010001000
0x04e: 0101111101-1010000010
0x04f: 0101111110-1010000001
0x050: 0110000111
0x051: 0110001101
0x052: 0110001110
0x053: 0110010011
0x054: 0110010101
0x055: 0110010110
0x056: 0110011001
0x057: 0110011010
0x058: 0110011100
0x059: 0110100011

FIG. 2A

SOURCE CODE (HEX) : CODE WORD (BIN)
----------------------------------------
0x05a: 0110100101
0x05b: 0110100110
0x05c: 0110101001
0x05d: 0110101010
0x05e: 0110101100
0x05f: 0110110001
0x060: 0110110010
0x061: 0110110100
0x062: 0110110111-1001001000
0x063: 0110111000
0x064: 0110111011-1001000100
0x065: 0110111101-1001000010
0x066: 0110111110-1001000001
0x067: 0111000011
0x068: 0111000110
0x069: 0111001001
0x06a: 0111001010
0x06b: 0111001100
0x06c: 0111010001
0x06d: 0111010010
0x06e: 0111010100
0x06f: 0111010111-1000101000
0x070: 0111011000
0x071: 0111011011-1000100100
0x072: 0111011101-1000100010
0x073: 0111011110-1000100001
0x074: 0111110011-1000001100
0x075: 0111110101-1000001010
0x076: 0111110110-1000001001
0x077: 0111111001-1000000110
0x078: 1000100111
0x079: 1000101011
0x07a: 1000101101
0x07b: 1000101110
0x07c: 1000110011
0x07d: 1000110101
0x07e: 1000110110
0x07f: 1000111001
0x080: 1000111100
0x081: 1001000111
0x082: 1001001011
0x083: 1001001101
0x084: 1001001110
0x085: 1001010011
0x086: 1001010101
0x087: 1001010110
0x088: 1001011001

SOURCE CODE (HEX) : CODE WORD (BIN)
----------------------------------------
0x089: 1001011010
0x08a: 1001011100
0x08b: 1001100011
0x08c: 1001100101
0x08d: 1001100110
0x08e: 1001101001
0x08f: 1001101010
0x090: 1001101100
0x091: 1001110001
0x092: 1001110010
0x093: 1001110111-0110001000
0x094: 1001111000
0x095: 1001111011-0110000100
0x096: 1001111101-0110000010
0x097: 1001111110-0110000001
0x098: 1010001101
0x099: 1010001110
0x09a: 1010010011
0x09b: 1010010101
0x09c: 1010010110
0x09d: 1010011001
0x09e: 1010011010
0x09f: 1010011100
0x0a0: 1010100011
0x0a1: 1010100101
0x0a2: 1010100110
0x0a3: 1010101001
0x0a4: 1010101010
0x0a5: 1010101100
0x0a6: 1010110001
0x0a7: 1010110010
0x0a8: 1010110100
0x0a9: 1010110111-0101001000
0x0aa: 1010111000
0x0ab: 1010111011-0101000100
0x0ac: 1010111101-0101000010
0x0ad: 1010111110-0101000001
0x0ae: 1011000011
0x0af: 1011000110
0x0b0: 1011001001
0x0b1: 1011001010
0x0b2: 1011001100
0x0b3: 1011010001
0x0b4: 1011010010
0x0b5: 1011010100
0x0b6: 1011010111-0100101000
0x0b7: 1011011000

FIG. 2B

SOURCE CODE (HEX) : CODE WORD (BIN)
--------------------------------------------
0x0b8: 1011011011-0100100100
0x0b9: 1011011101-0100100010
0x0ba: 1011011110-0100100001
0x0bb: 1011100001
0x0bc: 1011100010
0x0bd: 1011100100
0x0be: 1011100111-0100011000
0x0bf: 1011101011-0100010100
0x0c0: 1011101101-0100010010
0x0c1: 1011101110-0100010001
0x0c2: 1011111001-0100000110
0x0c3: 1011111100-0100000011
0x0c4: 1100000111
0x0c5: 1100001101
0x0c6: 1100001110
0x0c7: 1100010011
0x0c8: 1100010101
0x0c9: 1100010110
0x0ca: 1100011001
0x0cb: 1100011010
0x0cc: 1100011100
0x0cd: 1100100011
0x0ce: 1100100101
0x0cf: 1100100110
0x0d0: 1100101001
0x0d1: 1100101010
0x0d2: 1100101100
0x0d3: 1100110001
0x0d4: 1100110010
0x0d5: 1100110100
0x0d6: 1100110111-0011001000
0x0d7: 1100111000
0x0d8: 1100111011-0011000100
0x0d9: 1100111101-0011000010
0x0da: 1100111110-0011000001
0x0db: 1101000110
0x0dc: 1101001001
0x0dd: 1101001010
0x0de: 1101001100
0x0df: 1101010001
0x0e0: 1101010010
0x0e1: 1101010100
0x0e2: 1101010111-0010101000
0x0e3: 1101011000
0x0e4: 1101011011-0010100100
0x0e5: 1101011101-0010100010
0x0e6: 1101011110-0010100001
0x0e7: 1101100001

SOURCE CODE (HEX) : CODE WORD (BIN)
--------------------------------------------
0x0e8: 1101100010
0x0e9: 1101100100
0x0ea: 1101100111-0010011000
0x0eb: 1101101000
0x0ec: 1101101011-0010010100
0x0ed: 1101101101-0010010010
0x0ee: 1101101110-0010010001
0x0ef: 1101110011-0010001100
0x0f0: 1101110101-0010001010
0x0f1: 1101110110-0010001001
0x0f2: 1101111001-0010000110
0x0f3: 1101111100-0010000011
0x0f4: 1110000011
0x0f5: 1110000110
0x0f6: 1110001001
0x0f7: 1110001010
0x0f8: 1110001100
0x0f9: 1110010001
0x0fa: 1110010010
0x0fb: 1110010100
0x0fc: 1110010111-0001101000
0x0fd: 1110011000
0x0fe: 1110011011-0001100100
0x0ff: 1110011101-0001100010
0x100: 1110011110-0001100001
0x101: 1110100001
0x102: 1110100010
0x103: 1110100100
0x104: 1110100111-0001011000
0x105: 1110101000
0x106: 1110101011-0001010100
0x107: 1110101101-0001010010
0x108: 1110101110-0001010001
0x109: 1110110011-0001001100
0x10a: 1110110101-0001001010
0x10b: 1110110110-0001001001
0x10c: 1110111001-0001000110
0x10d: 1110111100-0001000011

FIG. 2C

ENCODING WITH INTEGRATED ERROR-DETECTION

BACKGROUND

Data may be encoded by matching an n-bit symbol of the data to a corresponding coded symbol having n+2 bits. Transmission losses and other conditions may result in error within the encoded data. In order to detect the error, some encoding schemes transmit additional symbols with the encoded data. Once detected, the errors may be corrected by resending the data or by performing complex data correction schemes with information in other supplementary symbols.

SUMMARY

Embodiments are disclosed herein for encoding n-bit pre-coded data with n+2-bit code words. For example, a method of encoding a data set including one or more n-bit pre-coded symbols in an encoder of a computing system includes determining a plurality of n+2-bit code words, each of the plurality of n+2-bit code words having two or greater Hamming distance from one another. Each of the plurality of n+2-bit code words may be mapped to a corresponding source symbol in order to form a key for encoding data. The method may further include receiving the one or more n-bit pre-coded symbols at the encoder, matching each n-bit pre-coded symbol to a corresponding n+2-bit code word based on the mapping to produce encoded data, and outputting the encoded data.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIGS. 2A-2C show an example list of n+2-bit code words corresponding to n-bit source code symbols in accordance with an embodiment of the present disclosure.

DETAILED DESCRIPTION

Some encoding methods utilize 8b/10b or similar encoding schemes that may result in "lost bandwidth," as the extra two bits in encoded code words do not provide any additional error correction or detection capabilities. Further, these methods may employ complex mechanisms for detecting and correcting errors in received encoded data. The present disclosure provides methods and systems for encoding data such that any two valid code words have at least two bits with different logical values than one another. In this way, single bit errors may be detected by a physical layer, as a received code word with a single bit error would not correspond to any valid code word. The physical layer may mark the symbol as bad, allowing higher layers to correct the symbol with forward error correction mechanisms.

Figure 1:
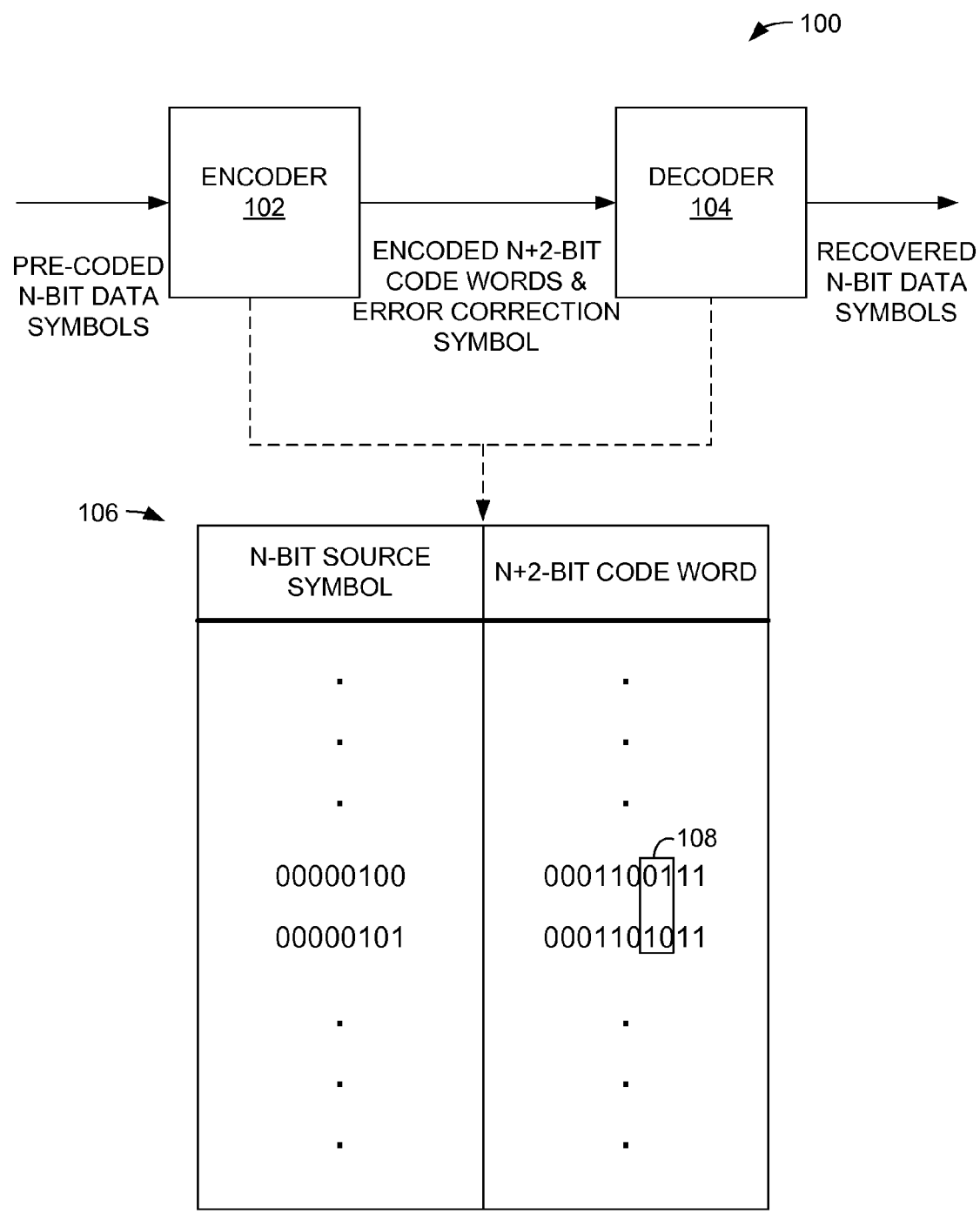
FIG. 1 shows an example encoding and/or decoding system in accordance with an embodiment of the present disclosure.

FIG. 1 illustrates an example encoding and/or decoding system 100. The system 100 may include an encoder 102 and a decoder 104. As depicted, one or more elements of the system 100 may be integrated into a single computing device and/or distributed across multiple computing devices. For example, the encoder 102 may be included in a first computing device, while the decoder 104 may be included in a second computing device. The first computing device may be configured to transmit data to the second computing device in accordance with any suitable wireless and/or wired protocols.

The encoder 102 and the decoder 104 may be configured to process data in accordance with the pipeline illustrated in FIG. 1. For example, pre-coded data symbols having n bits each may be input into the encoder 102. The encoder 102 generates and/or consults a table 106 responsive to receiving the pre-coded data symbols. For example, the table 106 may be a lookup table of valid n+2-bit code words. The encoder 102 may generate encoded data including encoded n+2-bit code words based on the table 106.

As shown in FIG. 1, the table 106 may include each valid n+2-bit code word for each n-bit source symbol. Each n-bit source symbol may be matched to one or more n+2-bit code words such that more than one n+2-bit code words may correspond to the same source symbol. During encoding, the encoder 102 may match a particular pre-coded n-bit data symbol to an n-bit source symbol and output an n+2-bit code word corresponding to the n-bit source symbol. For example, as shown in the table 106, a pre-coded n-bit data symbol of 00000100 may be associated with an n+2-bit code word of 0001100111. Therefore, the encoder 102 may output 0001100111 in response to receiving a pre-coded symbol of 00000100. In some embodiments, the encoder 102 may append or otherwise include one or more error correction symbols for the encoded data. The error correction symbols may include checksum information, cyclic redundancy check information, and/or any other suitable error correction information, as described in more detail below.

The decoder 104 may receive the encoded data, consult the table 106 and/or a local version of the table 106, and output recovered n-bit data symbols. Accordingly, the decoder 104 may match a received or otherwise input encoded n+2-bit code word to the n+2-bit code words in the table 106, then output an n-bit source symbol corresponding to the n+2-bit code word as the recovered n-bit data symbol. In contrast to the matching of source symbols to code words, any n+2-bit code word may be matched with only one n-bit source symbol in order to prevent uncertainty during decoding. Using the example above, if the decoder 104 receives the code word 0001100111 from the encoder 102, the decoder 104 may output 00000100 as the recovered n-bit data symbol. The decoder 104 may utilize the one or more error correction symbols from the encoder 102 to ensure that the recovered n-bit data symbols correctly represent and/or match the pre-coded n-bit data symbols.

The scenario described above assumes an error-free transmission, in which the decoder 104 receives the exact same symbol output by the encoder 102. In some scenarios, however, transmission errors may occur in which a received symbol does not directly correspond to a transmitted symbol. For example, errors may occur at various locations of a system, such as an input and/or output of an element or within the transmission medium. In order to detect and subsequently correct such errors, the encoder 102 may be configured to determine a plurality of code words such that each code word includes at least two different bits from each other code word. The determined code words may be generated by the encoder or received from an external table generator. This difference is referred to as a Hamming distance and is illustrated at box 108 of FIG. 1. As shown in box 108, the seventh and eighth bits (reading left to right) of the first code word are each different from the seventh and eighth bits of the second code word. All other bits are the same. As such, the illustrated example N+2-bit code words have a hamming distance equal to two.

By determining a list of valid code words each having a Hamming distance of two or greater from one another, a single bit error that occurs during transmission of a valid code word may be detected as an invalid code word at a receiving element. For example, the encoder 102 may output the code word 0001100111, but an error may cause the code word 0001101111 to be received at the decoder 104. The code word 0001101111 would not be a valid code word, because it has a Hamming distance of 1 from the valid code word 0001100111. When the decoder 104 consults the table 106, the received code word will not be located. Accordingly, the decoder may mark the code word as a bad symbol, such that it may be corrected. Once the code word is marked as a bad symbol, higher layers of the system may be configured to correct the error. The error detection based on receiving an invalid code word may allow the system to utilize more simplistic error correction mechanisms than systems that do not perform such error detection.

Further considerations for determining valid n+2-bit code words may be included to maintain and/or increase performance parameters in comparison to other encoding methods. For example, the encoding of the system 100 may adhere to some standards of 8 b/10 b encoding schemes. In some embodiments, the valid code words may have a bounded disparity of ones and zeros such that the number of ones and zeros sent over a period of time is substantially equal and the transmission is DC balanced. Some source symbols may be associated with two valid code words. Selection of a code word for a particular pre-coded symbol matching one of these source symbols may be performed based on the code words that have been transmitted prior to encoding the particular pre-coded symbol. For example, if a running disparity of the transmission is negative, in which the number of zeros transmitted is greater than the number of ones, the code word having more ones than zeros may be selected to correspond to the particular pre-coded symbol.

The valid n+2-bit code words may also be selected to have no more than a maximum number of consecutive ones and/or a maximum number of consecutive zeros in order to achieve a particular edge rate. Receiving adjacent bits with different logical values (e.g., toggling from one to zero) allows a system to perform clock synchronization and correct drift that may be experienced after receiving a string of bits having the same logical value. Therefore, the valid n+2-bit code words may be configured to match a suitable edge rate. For example, the n+2-bit code words may include no more than six consecutive bits of the same logical value to achieve an edge rate of 1/6. As shown in table 106, each of the example code words have at most 3 consecutive bits of the same logical value—3 zeros and 3 ones in the first code word and 3 zeros in the second code word. It is appreciated that the encoder and/or table generator may select code words configured to achieve any suitable edge rate; however a number of possible valid n+2-bit code words decreases as the edge rate decreases.

The n+2-bit code words may also be selected such that a particular number of control codes is available. For example, when encoding 8-bit pre-coded symbols with 10-bit code words, 270 symbols may be represented by the code words. As the 8-bit pre-coded symbols have 256 possible combinations, 256 of the 270 code words may be reserved for representing data, while the remaining 14 symbols may represent control codes. Control codes may include any suitable code for controlling an aspect of the encoding and/or decoding system, including but not limited to start-of-frame, end-of-frame, etc.

Assignment of pre-coded symbols and control codes to the code words may be arbitrary, with the exception of a "COM" or "comma" symbol. The "COM" or "comma" symbol may define alignment of the code words and may be assigned to a particular and/or predefined code word and/or source symbol. The assignment of the COM symbol may be selected such that, in any valid incoming bit-stream, the only place the 10-bit series corresponding to the COM symbol can appear is where a COM symbol was actually transmitted. In other words, the COM symbol is assigned to a code word that may not be formed from any combination of remaining code words. For example, the COM symbol may be assigned to symbol number 0x003 (code word 0001011110) when encoding 8-bit pre-coded data with 10-bit code words in accordance with the present disclosure. The encoder and/or table generator may search the 10-bit code words for a suitable COM symbol. Further, in order to ensure detection of the COM symbol even in the presence of bit-errors, the COM symbol may be transmitted two or more times in a row.

FIGS. 2A-2C show an example list 200 of 270 code words determined to satisfy the above-described encoding considerations and assigned to 256 code words and 14 control codes. The list 200 shows the 270 source codes (in hexadecimal representation) and each corresponding code word (in binary representation). As discussed above, the Hamming distance between each of the 270 code words is at least 2, allowing for detection of single-bit corruption in a received symbol. In other words, each of the plurality of code words has a two or greater Hamming distance from one another. Further, the code words have a minimum edge rate of 1/6 and include 14 control codes. FIG. 2C illustrates these 14 control codes as corresponding to source codes 0x101 through 0x10d and source code 0x003 (COM symbol).

Figure 3:
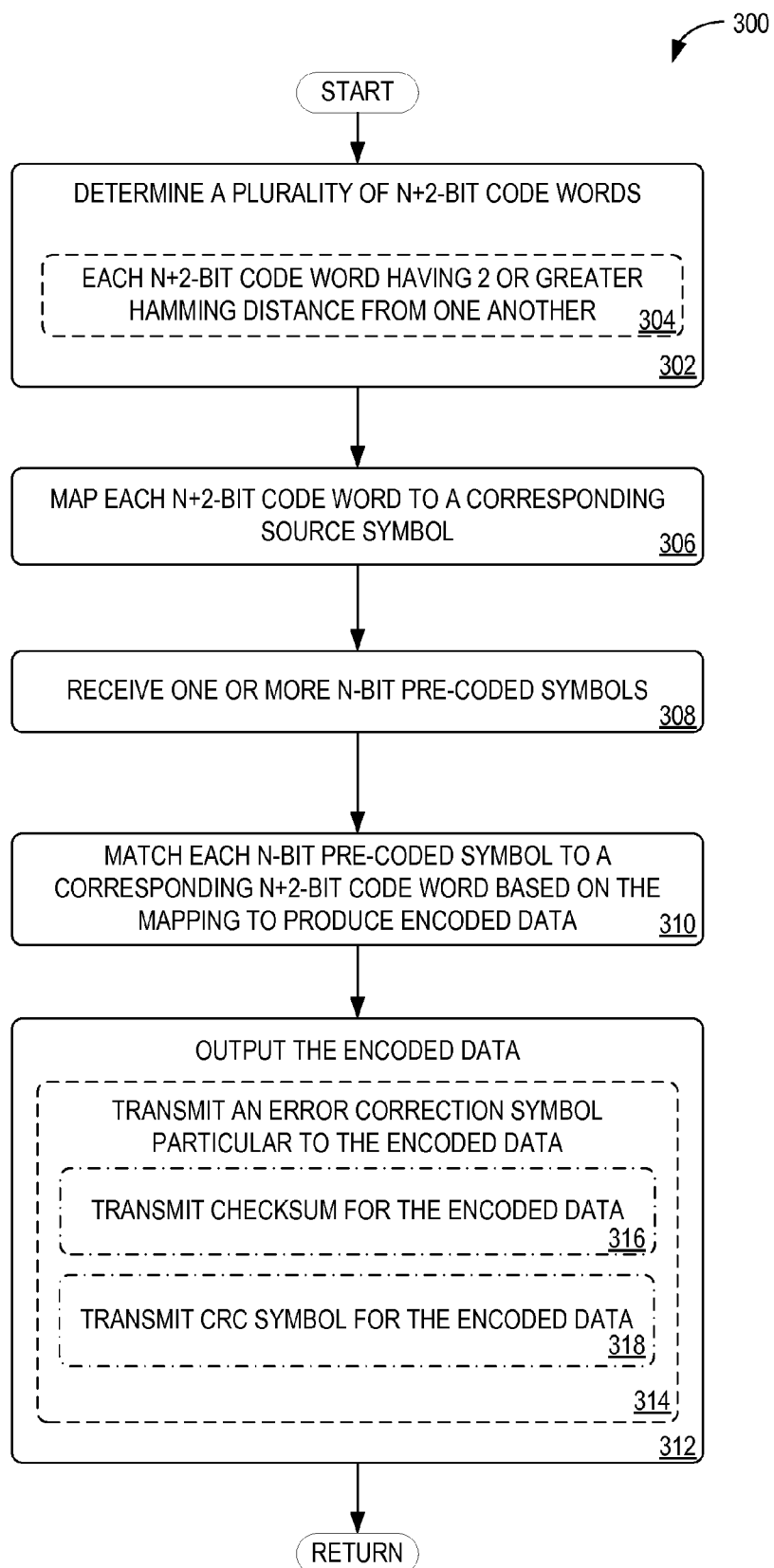
FIG. 3 shows an example method of encoding n-bit pre-coded data to produce encoded data in accordance with an embodiment of the present disclosure.

FIG. 3 illustrates a method 300 of encoding a data set including one or more n-bit pre-coded symbols in an encoder of a computing system. For example, the method of 300 may be performed by encoder 102 of FIG. 1 or computing system 500 of FIG. 5. The method 300 includes, at 302, determining a plurality of n+2-bit code words. For example, as discussed above, 8 b/10 b encoding may be utilized such that 10-bit code words are determined in order to encode 8-bit data symbols. However, the method 300 may be utilized with any suitable n/n+2 encoding scheme, including but not limited to 16 b/18 b encoding, 32 b/34 b encoding, etc. As indicated at 304, the code words may be selected or otherwise determined such that each n+2-bit code word has a 2 or greater Hamming distance from one another.

The method 300 includes mapping each n+2-bit code word to a corresponding source symbol, as indicated at 306. For example, as shown in the list 200 of FIG. 2, each 10-bit code is mapped to a corresponding 8-bit source symbol. At

308, the method 300 includes receiving one or more n-bit pre-coded symbols. The pre-coded symbols may be received at an input of the encoder and/or from an external computing device. It is to be understood that the plurality of code words may be determined after and/or responsive to receiving the one or more n-bit pre-coded symbols at 308.

The method 300 further includes matching each n-bit pre-coded symbol to a corresponding n+2-bit code word based on the mapping of 308 in order to produce encoded data at 310. At 312, the method includes outputting the encoded data. In some embodiments, the encoded data may be output and/or transmitted to a computing device external to the encoder that performs the method 300. In additional or alternative embodiments, the encoded data may be output and/or transmitted to an element that is local to the encoder.

The two or greater Hamming distance between each of the code words may allow a physical layer to determine and/or mark invalid symbols, thereby detecting single-bit error in the encoded data. As indicated at 314, the encoder may also transmit an error correction symbol particular to the encoded data to allow forward error correction for the encoded data. The encoder may transmit a checksum for the encoded data, as indicated at 316, and/or a cyclic redundancy check (CRC) symbol for the encoded data, as indicated at 318. For example, while the physical layer may perform error detection based on receiving invalid symbols, a higher layer of the OSI model, such as the link layer, may perform error correction using the extra symbol transmitted at 314. Such error correction may allow for retry-less communication links while maintaining mean time between failure values that are thought to approach or even exceed one million hours.

Figure 4:
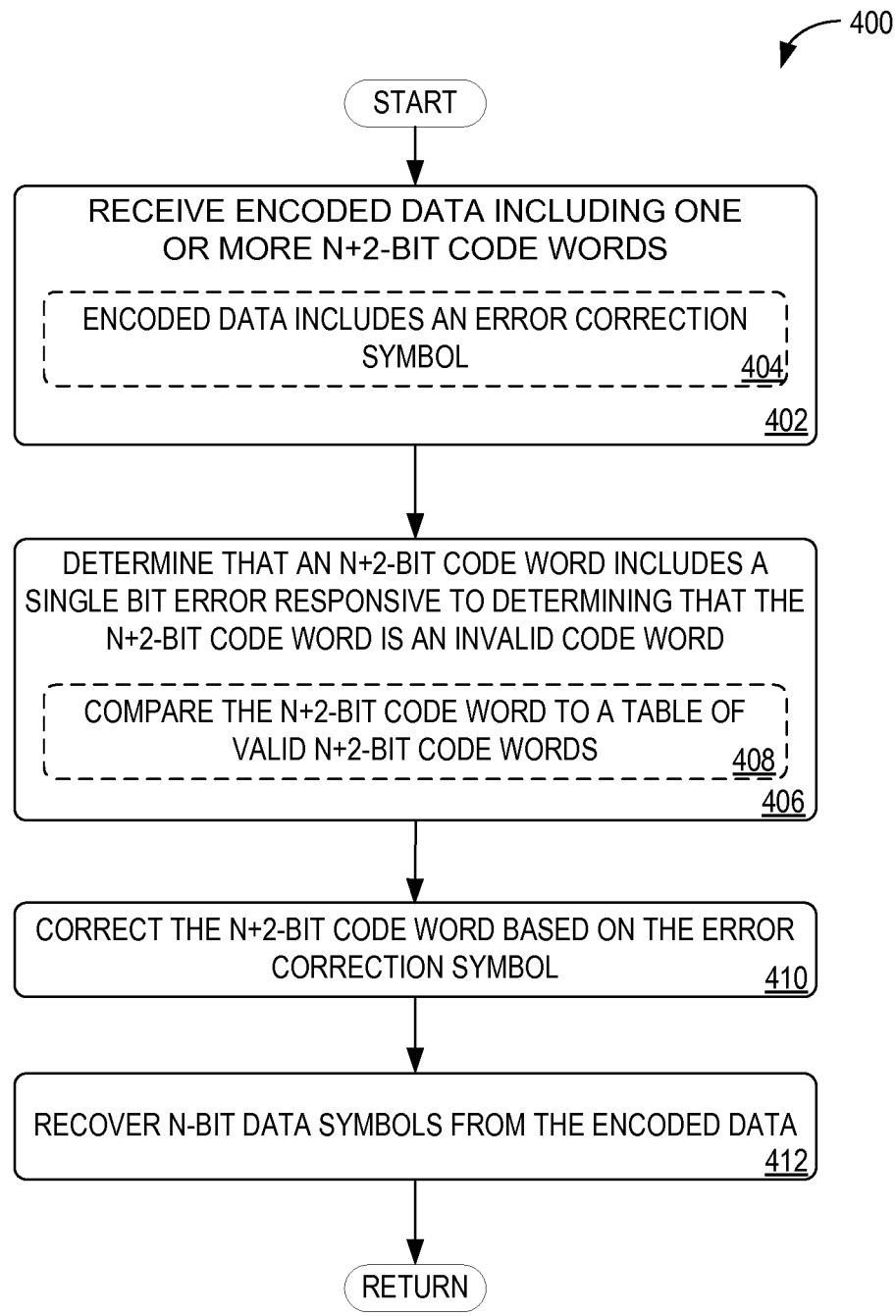
FIG. 4 shows an example method of decoding n+2-bit encoded data in accordance with an embodiment of the present disclosure.

The error detection and correction for encoded data is described in more detail with respect to FIG. 4, which shows a method 400 for decoding data in accordance with an embodiment of the present disclosure. For example, the method 400 may be performed by the decoder 104 of FIG. 1 or computing system 500 of FIG. 5. The method 400 includes, at 402, receiving encoded data including one or more n+2-bit code words. The encoded data may include an error correction symbol, as indicated at 404. For example, the encoded data may be encoded and output as described in method 300.

The method 400 further includes, at 406, determining that an n+2-bit code word includes a single-bit error responsive to determining that the n+2-bit code word is an invalid code word. Determining that the n+2-bit code word is an invalid code word may optionally include comparing the n+2-bit code word to a table of valid n+2-bit code words, as indicated at 408. For example, upon generating or otherwise determining a plurality of n+2-bit code words, an encoder may store the valid code words locally and/or at an external storage device. A decoder may receive the valid code words from the encoder and/or retrieve the valid code words from an accessible storage device. In some embodiments, the encoder may transmit a table of valid code words and/or an identifier for a storage location of the table of valid code words to the decoder responsive to determining the valid code words. In additional or alternative embodiments, the decoder may request the table of valid code words upon receiving encoded data. The encoded data may include information for locating and/or requesting the table of valid code words.

As indicated at 410, the method 400 includes correcting the n+2-bit code word based on the error correction symbol. In accordance with the Open Systems Interconnection (OSI) model, a computing device may be segmented into stacked layers that each serve an immediately higher layer and are served by an immediately lower layer. The error detection indicated at 406 and 408 may be performed at any suitable element or layer of a computing device including a decoder. For example, the error detection may be performed at a physical, or lowest, layer of infrastructure of the computing device, such that the invalid symbol is marked when received at the physical layer.

However, the error correction indicated at 410 may be performed by a higher layer than the physical layer, such as the link layer. The higher layer may utilize the error correction symbol to perform forward error correction such that the symbol may be recovered without resending the symbol. Since the symbol that includes a single-bit error is known, checksum symbols, CRC symbols, and/or XOR-based single-symbol corruption correction schemes may be utilized to correct the symbol marked as invalid or "bad." For example, in XOR-based single-symbol corruption schemes, an XOR sum of bits of the encoded data may be determined and transmitted as a parity bit. When received, the receiver may reconstruct a corrupted data symbol marked invalid or "bad" by the physical layer by: modifying the stream by replacing the corrupted data symbol with a 0 bit, calculating the new XOR parity on the modified stream, and XOR-ing the locally computed parity with the received parity. The result of the XOR operation is the recovered data symbol. Therefore, given the information in the error correction symbol and the knowledge of the "bad" symbol, the upper layer of the computing device may be able to recover the n-bit data symbols from the encoded data, as indicated at 412.

The combination of error detection at the physical layer and error correction at an upper layer enables forward error correction that reduces bandwidth usage when compared to other encoding mechanisms. For example, the decoder may correct errors utilizing one extra symbol of data and without resending data or consulting complex error correction appendices. Further, by providing more control codes than other encoding schemes, the encoding methods and systems of the present disclosure allows for more flexibility in protocol design than other encoding methods.

In some embodiments, the methods and processes described herein may be tied to a computing system of one or more computing devices. In particular, such methods and processes may be implemented as a computer-application program or service, an application-programming interface (API), a library, and/or other computer-program product.

Figure 5:
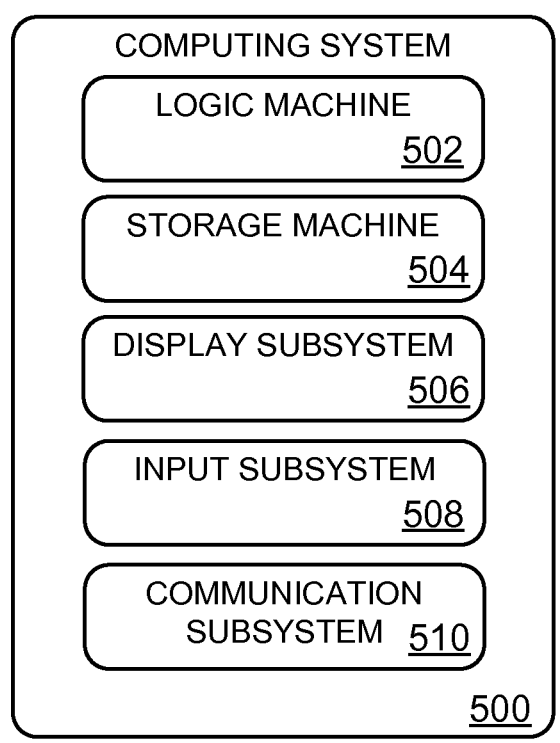
FIG. 5 is a block diagram of an example computing device in accordance with an embodiment of the present disclosure.

FIG. 5 schematically shows a non-limiting embodiment of a computing system 500 that can enact one or more of the methods and processes described above. The computing system 500 is shown in simplified form. The computing system 500 may take the form of one or more mobile computing devices, head-mounted display devices, gaming consoles, mobile communication devices (e.g., smart phone), tablet computers, server computers, home-entertainment computers, network computing devices, personal computers, and/or other computing devices. For example, the computing system 500 may include or be included within the encoder 102 and/or the decoder 104 of FIG. 1.

The computing system 500 includes a logic machine 502 and a storage machine 504. The computing system 500 may optionally include a display subsystem 506, an input subsystem 508, a communication subsystem 510, and/or other components not shown in FIG. 5.

The logic machine 502 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

The storage machine 504 includes one or more physical devices configured to store and hold instructions (e.g., computer-readable and/or machine readable instructions) executable by the logic machine to implement the methods and processes described herein. For example, the logic machine 502 may be in operative communication with a sensor interface and the storage machine 504. When such methods and processes are implemented, the state of the storage machine 504 may be transformed—e.g., to hold different data.

The storage machine 504 may include removable and/or built-in devices. The storage machine 504 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 904 may include volatile, nonvolatile, dynamic, static, read/write, read-only, random-access, sequential-access, location-addressable, file-addressable, and/or content-addressable devices.

It will be appreciated that the storage machine 504 includes one or more physical devices. However, aspects of the instructions described herein alternatively may be propagated by a communication medium (e.g., an electromagnetic signal, an optical signal, etc.).

Aspects of the logic machine 502 and the storage machine 504 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, the display subsystem 506 may be used to present a visual representation of data held by the storage machine 504. This visual representation may take the form of a graphical user interface (GUI). As the herein described methods and processes change the data held by the storage machine, and thus transform the state of the storage machine, the state of display subsystem 506 may likewise be transformed to visually represent changes in the underlying data. The display subsystem 506 may include one or more display devices utilizing virtually any type of technology. Such display devices may be combined with the logic machine 502 and/or the storage machine 504 in a shared enclosure, or such display devices may be peripheral display devices.

When included, the input subsystem 508 may comprise or interface with one or more user-input devices such as a touch screen, keyboard, mouse, microphone, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, the communication subsystem 510 may be configured to communicatively couple the computing system 500 with one or more other computing devices. The communication subsystem 510 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow the computing system 500 to send and/or receive messages to and/or from other devices via a network such as the Internet. For example, the communication subsystem 510 may allow the encoder 102 of FIG. 1 to send and/or receive messages to and/or from the decoder 104. The communication subsystem 510 may similarly allow the encoder 102 and/or the decoder 104 to send, receive, and/or otherwise access the table 106 of FIG. 1.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A computing device for decoding encoded data, the computing device including:
   a logic machine; and
   a storage machine storing instructions executable by the logic machine to:
      receive, from an encoder, the encoded data including a plurality of n+2-bit code words and an error correction symbol;
      determine, at a physical layer of the computing device, that a first n+2-bit code word of the plurality of n+2-bit code words includes an error responsive to determining that the first n+2-bit code word has a Hamming distance of one relative to a valid n+2-bit code word;
      responsive to determining that the first n+2-bit code word includes an error, mark, with the physical layer, the first n+2-bit code word as an invalid code word and pass the marked first n+2-bit code word with the plurality of n+2-bit code words to a higher layer of the computing device than the physical layer;

receive, at the higher layer of the computing device, the marked first n+2-bit code word with the plurality of n+2-bit code words and the error correction symbol;

correct, at the higher layer of the computing device, the first n+2-bit code word based on the error correction symbol; and output a plurality of n-bit data symbols recovered from the plurality of encoded n+2-bit code words.

2. The computing device of claim 1, wherein the instructions are further executable to recover the plurality of n-bit data symbols by matching each of the plurality of encoded n+2-bit code words, including the corrected first n+2-bit code word, to a corresponding n-bit source symbol in a table, the table mapping valid code words to source symbols.

3. The system of claim 1, wherein the first n+2-bit code word and the valid n+2-bit code word include any two code words of the plurality of n+2-bit code words.

4. The system of claim 1, wherein the error correction symbol comprises a checksum for the encoded data.

5. The system of claim 1, wherein the error correction symbol comprises a cyclic redundancy check (CRC) symbol for the encoded data.

6. The system of claim 1, wherein each of the plurality of n+2-bit code words includes ten bits and each of the corresponding n-bit data symbols includes eight bits, and where the valid n+2-bit code word is one of a plurality of valid n+2-bit code words included in a table mapping each of the plurality of valid n+2-bit code words to a corresponding n-bit source symbol.

7. The system of claim 1, wherein the higher layer of the computing device includes the link layer of the computing device.

8. On a computing device, a method of recovering precoded n-bit data symbols from encoded data, where n is a positive integer number of bits, the method comprising:

receiving the encoded data including one or more n+2-bit code words and an error correction symbol;

determining, at a physical layer of the computing device, that an n+2-bit code word includes a single bit error responsive to determining that the n+2-bit code word has a Hamming distance of one relative to a valid n+2-bit code word;

marking, at the physical layer of the computing device, the n+2-bit code word that is determined to be an invalid code word;

correcting, at a higher layer of the computing device than the physical layer, the n+2-bit code word based on the error correction symbol; and recovering the n-bit data symbols from the encoded data.

9. The method of claim 8, wherein the error correction symbol is a checksum symbol.

10. The method of claim 8, wherein the error correction symbol is a cyclic redundancy check (CRC) symbol.

11. The method of claim 8, wherein the n-bit data symbols include 8 bits and the n+2-bit code words include 10 bits.

12. The method of claim 8, further comprising receiving a table of valid code words.

13. The method of claim 12, wherein determining that the n+2-bit code word is an invalid code word comprises comparing the n+2-bit code word to the table of valid code words.

14. On a computing device, a method for decoding encoded data, the method comprising:

receiving, from an encoder, the encoded data including a plurality of n+2-bit code words and an error correction symbol;

determining, at a physical layer of the computing device, that a first n+2-bit code word of the plurality of n+2-bit code words includes an error responsive to determining that the first n+2-bit code word has a Hamming distance of one relative to a valid n+2-bit code word;

responsive to determining that the first n+2-bit code word includes an error, marking, with the physical layer, the first n+2-bit code word as an invalid code word and passing the marked first n+2-bit code word with the plurality of n+2-bit code words to a higher layer of the computing device than the physical layer;

receiving, at the higher layer of the computing device, the marked first n+2-bit code word with the plurality of n+2-bit code words and the error correction symbol;

correcting, at the higher layer of the computing device, the first n+2-bit code word based on the error correction symbol; and outputting a plurality of n-bit data symbols recovered from the plurality of encoded n+2-bit code words.

15. The method of claim 14, wherein each of the plurality of n+2-bit code words includes ten bits and each of the corresponding n-bit data symbols includes eight bits, and where the valid n+2-bit code word is one of a plurality of valid n+2-bit code words included in a table mapping each of the plurality of valid n+2-bit code words to a corresponding n-bit source symbol.

16. The method of claim 14, wherein the error correction symbol comprises a checksum for the encoded data.

17. The method of claim 14, wherein the error correction symbol comprises a cyclic redundancy check (CRC) symbol for the encoded data or an XOR sum of bits of the encoded data.

18. The method of claim 14, wherein each of the plurality of n+2-bit code words includes at most six consecutive bits of the same value.

19. The method of claim 14, wherein the higher layer of the computing device includes the link layer of the computing device.

20. The method of claim 14, further comprising recovering the plurality of n-bit data symbols by matching each of the plurality of encoded n+2-bit code words, including the corrected first n+2-bit code word, to a corresponding n-bit source symbol in a table, the table mapping valid code words to source symbols.

* * * * *